(12) United States Patent
Kalra et al.

(10) Patent No.: US 11,063,580 B2
(45) Date of Patent: Jul. 13, 2021

(54) INPUT BUFFER WITH WIDE RANGE OF I/O VOLTAGE LEVEL

(71) Applicant: Texas Instruments Incorporated, Dallas, TX (US)

(72) Inventors: Pranshu Kalra, Bangalore (IN); Srikanth Srinivasan, Bangalore (IN); Devraj Rajagopal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/930,861

(22) Filed: Jul. 16, 2020

(65) Prior Publication Data

US 2021/0119620 A1 Apr. 22, 2021

(30) Foreign Application Priority Data

Oct. 18, 2019 (IN) .............................. 201941042292

(51) Int. Cl.
| | |
|---|---|
| *H03K 17/687* | (2006.01) |
| *H03K 5/01* | (2006.01) |
| *H03K 19/20* | (2006.01) |
| *H03K 19/0175* | (2006.01) |
| *H03K 19/0185* | (2006.01) |
| *H03K 17/06* | (2006.01) |

(52) U.S. Cl.
CPC ............ *H03K 5/01* (2013.01); *H03K 17/063* (2013.01); *H03K 17/687* (2013.01); *H03K 19/0175* (2013.01); *H03K 19/0185* (2013.01); *H03K 19/20* (2013.01); *H03K 2217/0063* (2013.01); *H03K 2217/0072* (2013.01)

(58) Field of Classification Search
CPC ............ H03K 5/01; H03K 5/08; H03K 17/06; H03K 17/063; H03K 17/56; H03K 17/687; H03K 17/6872; H03K 19/0175; H03K 19/017509; H03K 19/0185; H03K 19/018507; H03K 19/018521; H03K 19/20; H03K 2217/0063; H03K 2217/0072
See application file for complete search history.

(56) References Cited

U.S. PATENT DOCUMENTS 10,673,436 B1 * 6/2020 Hegde .................. H03K 19/007
10,763,839 B2 * 9/2020 Chauhan ................ H03K 3/356

* cited by examiner

*Primary Examiner* — Long Nguyen
(74) *Attorney, Agent, or Firm* — John R. Pessetto; Charles A. Brill; Frank D. Cimino

(57) ABSTRACT

A receiver includes a low-side buffer having an input terminal coupled to receive an input signal and having an output terminal coupled to a buffer terminal. Responsive to the input signal being LOW, the low-side buffer is configured to couple the buffer terminal to ground. The receiver also includes a high-side buffer having an input terminal coupled to receive the input signal and having an output terminal coupled to the buffer terminal. Responsive to the input signal being HIGH, the high-side buffer is configured to provide an I/O voltage at the buffer terminal. The receiver also includes an output stage coupled to the buffer terminal and having a low voltage terminal configured to receive a low supply voltage. The output stage is configured to provide an output signal responsive to the I/O voltage at the buffer terminal, wherein the output signal is lower than the I/O voltage.

33 Claims, 4 Drawing Sheets

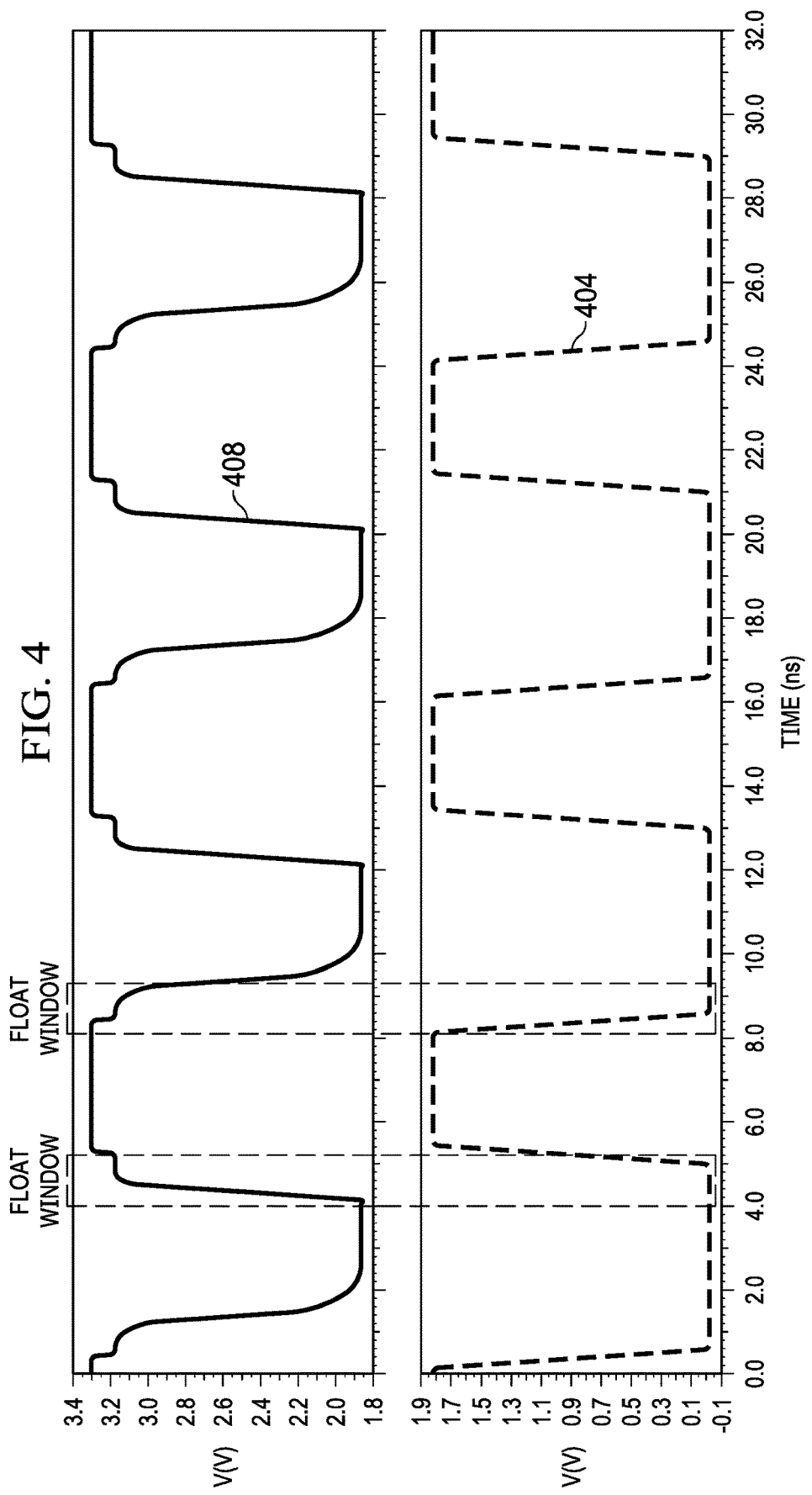

INPUT BUFFER WITH WIDE RANGE OF I/O VOLTAGE LEVEL

CROSS REFERENCE TO RELATED APPLICATIONS

This application claims priority from Indian provisional application No. 201941042292, filed Oct. 18, 2019, entitled "Wide Supply Voltage, Low Area, Low Power, High Speed Receiver Using Low-Voltage Gate Oxide", assigned to the present assignee and incorporated herein by reference.

BACKGROUND

The disclosure generally relates to input buffers, and particularly to input buffers which operate in a wide range of I/O voltage level.

DESCRIPTION OF THE RELATED ART

Analog devices such as ethernet PHY and Universal Serial Bus (USB) generally require input buffers (also referred herein as receivers) to enable connection to a physical medium such as an optical fiber or a cable. Since input signals from a physical medium may have a range of voltage levels, the input buffers (or receivers) are configured to operate in a range of input/output (I/O) voltage levels (e.g., 1.8V-3.3V). However, the input buffers are often implemented with thin-oxide MOSFETs with low voltage gates which can tolerate up to 1.8V. These input buffers generally require I/O supply level information in order to reliably receive the input voltages. Moreover, when the input signal switches at higher frequencies with low slew rates, existing input buffers suffer from voltage clipping induced crowbar condition (i.e., short circuit), which causes duty cycle distortion. Thus, existing input buffers generally operate either with known I/O supply level information or at low frequencies.

SUMMARY

Various aspects of the present disclosure are directed to receivers or input buffers configured to operate in a wide range of I/O voltage levels. In one aspect, a receiver includes a low-side buffer having an input terminal coupled to receive an input signal and having an output terminal coupled to a buffer terminal and having a reference voltage terminal coupled to a reference voltage. Responsive to the input signal being LOW, the low-side buffer is configured to couple the buffer terminal to ground. The receiver also includes a high-side buffer having an input terminal coupled to receive the input signal and having an output terminal coupled to the buffer terminal and having an input/output (I/O) terminal coupled to an I/O voltage and having a bias terminal coupled to a bias voltage. Responsive to the input signal being HIGH, the high-side buffer is configured to provide the I/O voltage at the buffer terminal. The receiver also includes a voltage subtractor configured to provide the bias voltage responsive to a difference between the reference voltage and the I/O voltage. The receiver also includes an output stage coupled to the buffer terminal and having a low voltage terminal configured to receive a low supply voltage. The output stage is configured to provide an output voltage responsive to the I/O voltage at the buffer terminal, wherein the output voltage is lower than the I/O voltage.

In an additional aspect of the present disclosure, the low-side buffer is configured to prevent a short circuit conduction path between the reference voltage and ground when the input signal is HIGH, and the high-side buffer is configured to prevent a short circuit conduction path between the I/O voltage and ground when the input signal is LOW.

In an additional aspect of the disclosure, the low-side buffer includes a first switch having a gate terminal coupled to the reference voltage terminal and configured to remain ON responsive to the reference voltage. The first switch includes a drain terminal coupled to the input terminal of the low-side buffer. The first switch is configured to provide a first pass signal at a source terminal responsive to the input signal. The low-side buffer also includes a first inverter stage coupled between the reference voltage terminal and ground. The first inverter stage includes an input terminal coupled to receive the first pass signal and is configured to provide a first inversion signal responsive to the first pass signal. The low-side buffer also includes a low-side feedback MOSFET having a source terminal coupled to the reference voltage terminal and having a drain terminal coupled to the input terminal of the first inverter stage and having a gate terminal coupled to receive the first inversion signal. The low-side feedback MOSFET is configured to apply the reference voltage to the input terminal of the first inverter stage to prevent the short circuit conduction path between the reference voltage and ground when the input signal is HIGH. The low-side buffer also includes a second inverter stage coupled between the reference voltage terminal and ground and having an input terminal coupled to receive the first inversion signal. The second inverter stage is configured to provide a second inversion signal responsive to the first inversion signal. The low-side buffer also includes a first cascode stage coupled between the buffer terminal and ground and having an input terminal coupled to receive the first inversion signal. The first cascode stage is configured to couple the buffer terminal to ground responsive to the input signal being LOW.

In an additional aspect of the present disclosure, the high-side buffer includes a second switch having first and second gate terminals coupled to the bias voltage terminal. The second switch includes a drain terminal coupled to the input terminal of the high-side buffer and is configured to receive the input signal. The second switch is configured to provide a second pass signal responsive to the input signal. The high-side buffer also includes a third inverter stage coupled between the I/O terminal and ground. The third inverter stage includes a first input coupled to receive the second pass signal and is configured to provide a third inversion signal responsive to the second pass signal. The third inverter stage includes a second input coupled to receive the second inversion signal and is configured to prevent the short circuit conduction path between the I/O voltage and ground in response to the second inversion signal when the input signal is LOW. The high-side buffer also includes a second cascode stage coupled between the I/O terminal and the buffer terminal. The second cascode stage includes a first input coupled to receive the third inversion signal. The second cascode stage is configured to provide the I/O voltage at the buffer terminal when the input signal is HIGH.

In an additional aspect of the present disclosure, the output stage includes a third switch having a gate terminal coupled to the reference voltage terminal and having a drain terminal coupled to the buffer terminal. Responsive to the reference voltage, the third switch is configured to remain ON to provide a conduction path between its drain and source terminals. The output stage also includes a fourth inverter stage coupled between the low supply voltage terminal and ground. The fourth inverter stage includes an input terminal coupled to the source terminal of the third switch. The fourth inverter stage is configured to provide a fourth inversion signal. The output stage also includes a fifth inverter stage coupled between the low supply voltage terminal and ground. The fifth inverter stage includes an input terminal coupled to receive the fourth inversion signal and is configured to provide the output signal.

In an additional aspect of the present disclosure, the first switch is a drain-extended NMOS transistor configured to remain ON responsive to the reference voltage applied to its gate terminal.

In an additional aspect of the present disclosure, the first inverter stage includes a PMOS transistor and an NMOS transistor coupled in an inverter configuration. The gate terminals of the PMOS and NMOS transistors are coupled to receive the first pass signal, and the drain terminals of the PMOS and NMOS transistors are coupled to provide the first inversion signal.

In an additional aspect of the present disclosure, the second inverter stage includes a PMOS transistor and an NMOS transistor coupled in an inverter configuration. The gate terminals of the PMOS and NMOS transistors are coupled to receive the first inversion signal, and the drain terminals of the PMOS and NMOS transistors are coupled to provide the second inversion signal.

In an additional aspect of the present disclosure, the first cascode stage includes an upper and a lower NMOS transistors coupled between the buffer node and ground. The gate terminal of the upper NMOS transistor is coupled to the reference voltage terminal and the gate terminal of the lower NMOS transistor is coupled to receive the first inversion signal. The upper NMOS transistor is configured to remain ON responsive to the reference voltage applied to the gate terminal of the upper NMOS transistor.

In an additional aspect of the present disclosure, the second switch includes a drain-extended PMOS transistor and a second PMOS transistor coupled together. The drain-extended PMOS transistor includes a drain terminal coupled to the input terminal of the high-side buffer and includes a source terminal coupled to a drain terminal of the second PMOS transistor. The drain-extended PMOS transistor and the second PMOS transistor include gate terminals coupled to the bias voltage terminal. The drain-extended PMOS transistor is configured to remain ON responsive to the bias voltage applied to its gate terminal.

In an additional aspect of the present disclosure, the third inverter stage includes two PMOS transistors and an NMOS transistor coupled between the I/O voltage terminal and ground. The first PMOS transistor includes a gate terminal coupled to receive the second pass signal and includes a drain terminal to provide the third inversion signal. The NMOS transistor includes a gate terminal coupled to receive the second inversion signal and is configured to prevent the short circuit conduction path between the I/O voltage and ground when the second inversion signal is LOW.

In an additional aspect of the present disclosure, the second cascode stage includes a first PMOS transistor having a gate terminal coupled to receive the third inversion signal and a second PMOS transistor having a gate terminal coupled to the bias voltage terminal. The first and second PMOS transistors are configured to turn ON to provide the I/O voltage at the buffer terminal when the input signal is HIGH.

In an additional aspect of the present disclosure, the low-side feedback MOSFET is a PMOS transistor having a gate terminal coupled to receive the first inversion signal.

The PMOS transistor is configured to turn ON when the first inversion signal is LOW to prevent a short circuit conduction path between the reference voltage and ground when the input signal is HIGH.

In an additional aspect of the present disclosure, the fourth inverter stage includes a PMOS transistor and an NMOS transistor coupled in an inverter configuration. The gate terminals of the PMOS and NMOS transistors are coupled to the drain terminal of the third switch.

In an additional aspect of the present disclosure, the fifth inverter stage includes a PMOS transistor and an NMOS transistor coupled in an inverter configuration. The drain terminals of the PMOS and NMOS transistors are coupled to provide the output signal.

In an additional aspect of the present disclosure, a receiver includes a low-side buffer having an input terminal coupled to receive an input signal and having an output terminal coupled to a buffer terminal and having a reference voltage terminal coupled to a reference voltage. Responsive to the input signal being LOW, the low-side buffer is configured to couple the buffer terminal to ground. The receiver also includes a high-side buffer having an input terminal coupled to receive the input signal and having an output terminal coupled to the buffer terminal and having an input/output (I/O) terminal coupled to an I/O voltage and having a bias terminal coupled to a bias voltage. Responsive to the input signal being HIGH, the high-side buffer is configured to provide the I/O voltage at the buffer terminal. The receiver also includes an output stage coupled to the buffer terminal and having a low voltage terminal configured to receive a low supply voltage. The output stage is configured to provide an output signal responsive to the I/O voltage at the buffer terminal, wherein the output signal is lower than the I/O voltage.

In an additional aspect of the present disclosure, a receiver includes a low-side buffer having an input terminal coupled to receive an input signal and having an output terminal coupled to a buffer terminal and having a reference voltage terminal configured to receive a reference voltage. The low-side buffer includes a first switch having a gate terminal coupled to the reference voltage terminal. The first switch is configured to remain ON responsive to the reference voltage. The first switch includes a drain terminal coupled to the input terminal of the low-side buffer. The first switch is configured to provide a first pass signal at a source terminal responsive to the input signal. The low-side buffer includes a first inverter stage coupled between the reference voltage terminal and ground. The first inverter stage includes an input terminal coupled to receive the first pass signal and is configured to provide a first inversion signal responsive to the first pass signal. The low-side buffer also includes a low-side feedback MOSFET having a source terminal coupled to the reference voltage terminal and having a drain terminal coupled to the input terminal of the first inverter stage and having a gate terminal coupled to receive the first inversion signal. The low-side feedback MOSFET is configured to apply the reference voltage to the input terminal of the first inverter stage to prevent a short circuit conduction path between the reference voltage and ground. The low-side buffer also includes a second inverter stage coupled between the reference voltage terminal and ground and having an input terminal coupled to receive the first inversion signal. The second inverter stage is configured to provide a second inversion signal responsive to the first inversion signal. The low-side buffer also includes a first cascode stage coupled between the buffer terminal and ground and having an input terminal coupled to receive the first inversion signal. The first cascode stage is configured to couple the buffer terminal to ground responsive to the input signal being LOW.

The receiver also includes a high-side buffer having an input terminal coupled to receive the input signal and having an output terminal coupled to the buffer terminal and having an input/output (I/O) terminal configured to receive an I/O voltage and having a bias terminal coupled to a bias voltage. The high-side buffer includes a second switch having first and second gate terminals coupled to the bias voltage terminal and includes a drain terminal coupled to the input terminal of the high-side buffer. The second switch is configured to provide a second pass signal responsive to the input signal. The high-side buffer also includes a third inverter stage coupled between the I/O terminal and ground. The third inverter stage includes a first input coupled to receive the second pass signal and is configured to provide a third inversion signal responsive to the second pass signal. The third inverter stage includes a second input coupled to receive the second inversion signal and is configured to prevent a short circuit conduction path between the I/O voltage and ground. The high-side buffer also includes a second cascode stage coupled between the I/O terminal and the buffer terminal. The second cascode stage includes a first input terminal coupled to receive the third inversion signal. The second cascode stage is configured to provide the I/O voltage at the buffer terminal when the input signal is HIGH. The receiver also includes an output stage coupled to the buffer terminal and having a low voltage terminal configured to receive a low supply voltage. The output stage is configured to provide an output signal responsive to the I/O voltage at the buffer terminal.

BRIEF DESCRIPTION OF THE DRAWINGS

FIGS. 4-5 are timing diagrams of waveforms

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

Figure 1:
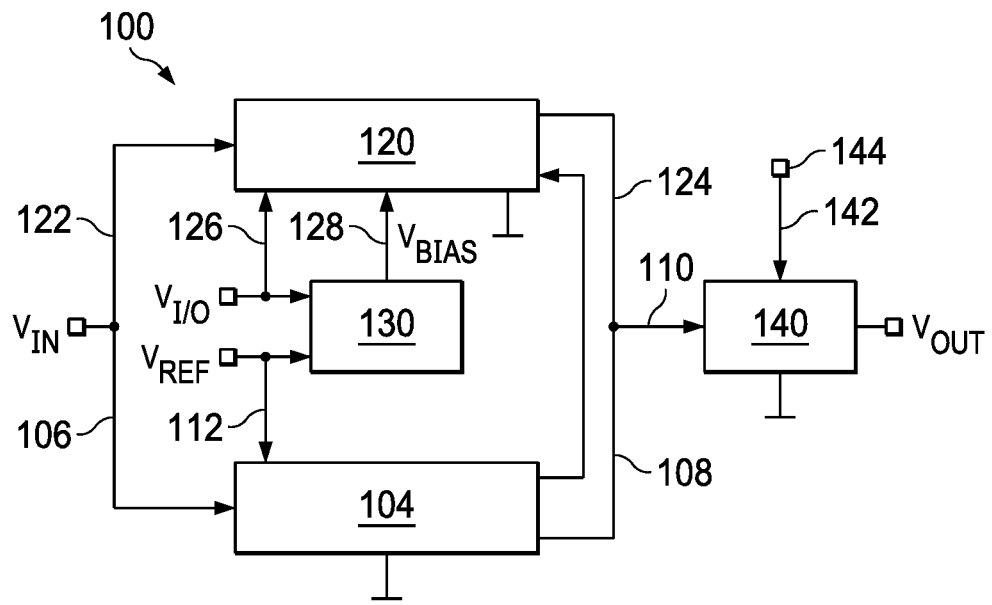
FIG. 1 is a high-level block diagram of a receiver in accordance with an exemplary embodiment of the present disclosure.

FIG. 1 is a high-level block diagram of a receiver 100 in accordance with an exemplary embodiment of the present disclosure. The receiver 100 is also referred herein as an input buffer. The receiver 100 is configured to operate in a wide range of input/output (I/O) voltage level (e.g., 1.8V-3.3V) and provide a low voltage output (e.g., 1.0 V).

The receiver 100 includes a low-side buffer 104 having an input terminal 106 which can be coupled to an input signal Vin and having an output terminal 108 coupled to a buffer terminal 110 (also referred to as a buffer node 110). The low-side buffer 104 also includes a reference voltage terminal 112 which can be coupled to a reference voltage Vref. In response to the input signal Vin being LOW, the low-side buffer 104 is configured to pull the buffer terminal 110 to LOW (i.e., ground).

With continuing reference to FIG. 1, the receiver 100 also includes a high-side buffer 120 having an input terminal 122 which can be coupled the input signal Vin and having an output terminal 124 coupled to the buffer terminal 110. The high-side buffer 120 also includes an input/output (I/O) terminal 126 which can be coupled to receive an I/O voltage V_I/O and includes a bias terminal 128 which can be coupled to a bias voltage Vbias. When the input signal Vin is equal to V_I/O (i.e., HIGH), the high-side buffer 120 is configured to set the buffer terminal 110 to V_I/O.

With continuing reference to FIG. 1, the receiver 100 also includes a voltage subtractor 130 configured to receive the reference voltage Vref and the I/O voltage V_I/O, and responsive to a difference between Vref and V_I/O the voltage subtractor 130 is configured to provide the bias voltage Vbias. The receiver 100 also includes an output stage 140 coupled to the buffer terminal 110 and having a low voltage terminal 142 which can be coupled to a low supply voltage 144 (e.g., 1V). The output stage 140 is configured to provide an output signal Vout.

In one aspect of the present disclosure, the receiver 100 is configured to provide a float window which prevents a crowbar current (i.e., short circuit current) between the I/O voltage V_I/O and ground. Also, the low-side buffer 104 is configured to prevent a short circuit conduction path between the reference voltage Vref and ground when the input signal Vin is equal to V_I/O (i.e., HIGH). Also, the high-side buffer 120 is configured to prevent a short circuit conduction path between the I/O voltage V_I/O and ground when the input signal Vin is LOW and in response to an inversion signal from the low-side buffer 104.

In an exemplary embodiment of the present disclosure, the I/O voltage V_I/O is between 1.8V and 3.3V, the reference voltage Vref is 1.8V, and the output voltage Vout is 1.0V.

Figure 2:
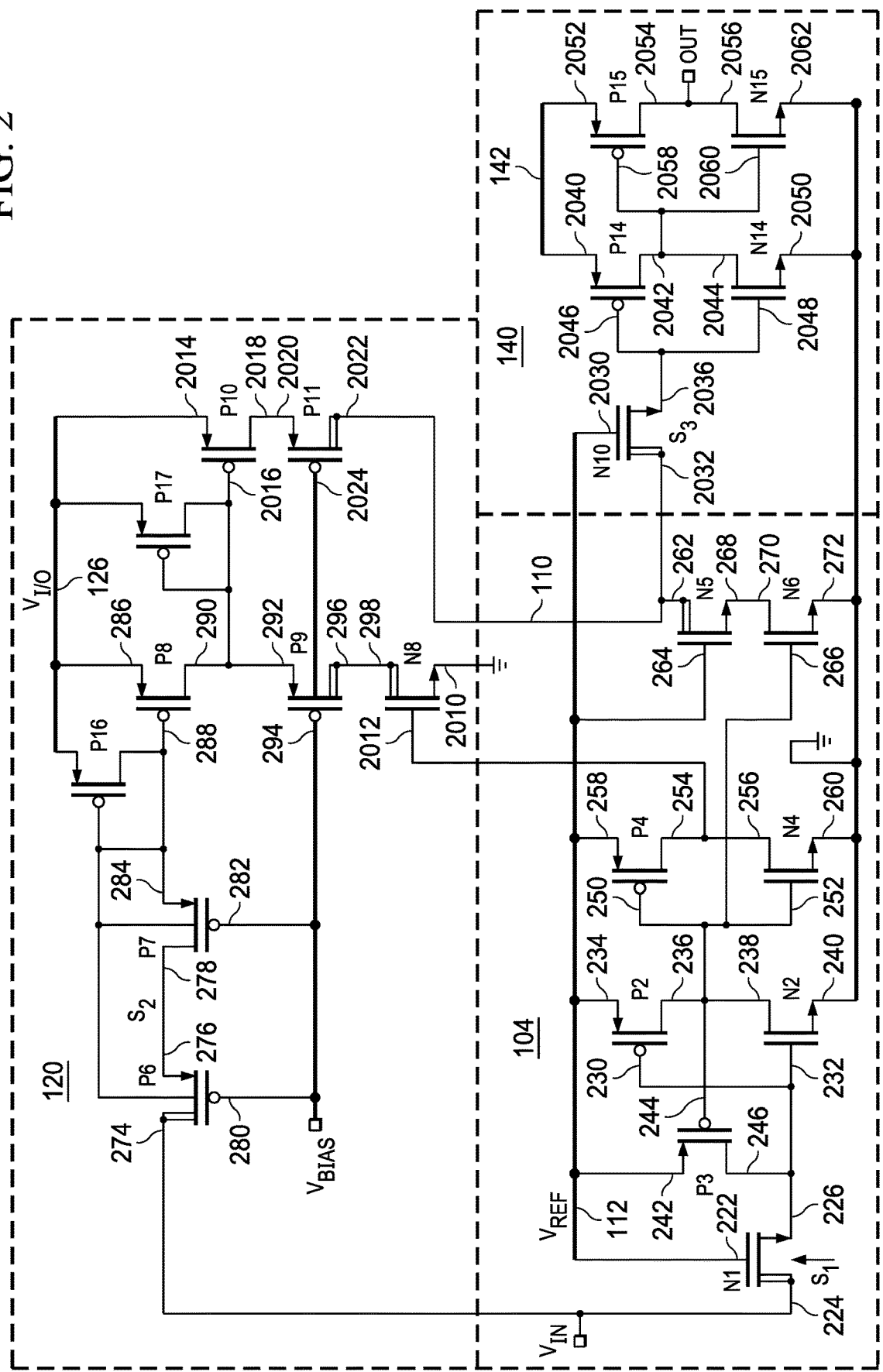
FIG. 2 illustrates a low-side buffer, a high-side buffer and an output stage in accordance with an exemplary embodiment of the present disclosure.

FIG. 2 illustrates the low-side buffer 104, the high-side buffer 120, and the output stage 140 in accordance with an exemplary embodiment. The low-side buffer 104 includes a first switch S1 having a gate terminal 222 coupled to the reference voltage terminal 112 which may be coupled to the reference voltage Vref. The first switch S1 is configured to remain ON responsive to the reference voltage Vref. The first switch S1 has a drain terminal 224 coupled to the input of the low-side buffer 104. The first switch S1 is configured to provide a first pass signal at a source terminal 226 responsive to the input signal Vin. Since the first switch S1 is configured to remain ON, the switch S1 essentially acts as a pass gate.

In one exemplary embodiment of the present disclosure, the first switch S1 is a drain-extended NMOS transistor N1 having a drain terminal sized to withstand a higher voltage than its gate terminal. For example, the drain terminal 224 of the drain extended NMOS transistor N1 may be rated to withstand 3.3V although the gate terminal 222 of the drain extended NMOS transistor N1 may be rated to withstand only 1.8V. Since the drain terminal 224 is coupled to the input of the low-side buffer 104, the NMOS transistor N1 (i.e., switch S1) can receive an input voltage of 3.3V, thereby allowing the receiver 100 to receive an input voltage of 3.3V.

The low-side buffer 104 also includes a first inverter stage comprising a PMOS transistor P2 and an NMOS transistor N2 coupled between the reference voltage terminal 112 and ground. The PMOS and NMOS transistors P2, N2 include respective gate terminals 230, 232 which are coupled to receive the first pass signal. Thus, the gate terminals 230 and 232 define an input of the first inverter stage comprising the transistors P2 and N2. The PMOS transistor P2 includes a source terminal 234 coupled to the reference voltage terminal 112. The PMOS and NMOS transistors P2, N2 include respective drain terminals 236 and 238 which are coupled together. The NMOS transistor N2 includes a source terminal 240 coupled to ground. In response to the first pass signal, the PMOS and NMOS transistors P2 and N2 provide a first inversion signal at the drain terminals 236 and 238.

The low-side buffer 104 also includes a low-side feedback PMOS transistor P3 having a source terminal 242 coupled to the reference voltage terminal 112 and having a drain terminal 246 coupled to the input of the first inverter stage formed by the PMOS and NMOS transistors P2 and N2. The PMOS transistor P3 includes a gate terminal 244 coupled to receive the first inversion signal. When the first inversion signal is LOW, the PMOS transistor P3 is turned ON, thus turning off both the drain extended NMOS transistor N1 and the PMOS transistor P2. As a result, a static current between the reference voltage Vref and ground is prevented.

The low-side buffer 104 also includes a second inverter stage comprising a PMOS transistor P4 and an NMOS transistor N4 coupled between the reference voltage terminal 112 and ground. The PMOS and NMOS transistors P4 and N4 have respective gate terminals 250 and 252 which are coupled to receive the first inversion signal. Thus, the gate terminals 250 and 252 define an input of the second inverter stage. The PMOS transistor P4 and the NMOS transistor N4 include respective drain terminals 254 and 256 which are coupled together to define an output. The PMOS transistor P4 includes a source terminal 258 coupled to the reference voltage terminal 112. The NMOS transistor N4 includes a source terminal 260 coupled to ground. In response to the first inversion signal, the PMOS and NMOS transistors P4 and N4 provide a second inversion signal at the drain terminals 254 and 256.

The low-side buffer 104 also includes a first cascode stage comprising NMOS transistors N5 and N6 coupled between the buffer terminal 110 and ground. The NMOS transistor N5 includes a drain terminal 262 coupled to the buffer terminal 110 and includes a gate terminal 264 coupled to the reference voltage terminal 112. The NMOS transistor N6 includes a gate terminal 266 coupled to receive the first inversion signal. The NMOS transistor N5 includes a source terminal 268 coupled to a drain terminal 270 of the NMOS transistor N6. The NMOS transistor N6 includes a source terminal 272 coupled to ground. The NMOS transistor N5 is configured to remain ON responsive to the reference voltage Vref applied to the gate terminal 264 of the NMOS transistor N5. When the first inversion signal is HIGH, the NMOS transistor N6 is turned ON, thus pulling the buffer terminal 110 to ground. In one exemplary embodiment, the NMOS transistor N5 is a drain extended NMOS.

With continuing reference to FIG. 2, the high-side buffer 120 includes a second switch S2 formed by PMOS transistors P6 and P7. The PMOS transistor P6 includes a drain terminal 274 coupled to the input of the high-side buffer 120 and includes a source terminal 276 coupled to a drain terminal 278 of the PMOS transistor P7. The PMOS transistors P6 and P7 include respective gate terminals 280 and 282 coupled to the bias voltage Vbias. The PMOS transistors P6 and P7 are configured to remain ON responsive to the bias voltage Vbias applied to the gate terminals 280 and 282. Thus, the PMOS transistors P6 and P7 essentially act as pass gates by remaining ON. The PMOS transistors P6 and P7 are configured to provide a second pass signal at a source terminal 284 responsive to the input signal Vin. Variations to the switch S2 are possible within the scope of the disclosure. For example, the switch S2 may be implemented with a single PMOS transistor instead of two PMOS transistors.

In an exemplary embodiment, the PMOS transistor P6 is a drain extended PMOS transistor having a drain terminal sized to withstand a higher voltage than the gate terminal. The drain terminal 274 of the drain extended PMOS transistor P3 can be rated to withstand 3.3V although the gate terminal 276 of the drain extended PMOS transistor P3 may be rated to withstand only 1.8V. Since the drain terminal 274 is coupled to the input of the high-side buffer 120, the PMOS transistor P6 can withstand an input voltage of 3.3V.

The high-side buffer 120 also includes a third inverter stage comprising PMOS transistors P8 and P9 and an NMOS transistor N8 coupled between the I/O terminal 126 and ground. The PMOS transistor P8 includes a source terminal 286 coupled to the I/O terminal 126 and includes a gate terminal 288 coupled to receive the second pass signal. The PMOS transistor P8 includes a drain terminal 290 coupled to a source terminal 292 of the PMOS transistor P9. The PMOS transistor P9 includes a gate terminal 294 coupled to the bias voltage Vbias. The PMOS transistor P9 includes a drain terminal 296 coupled to a drain terminal 298 of the NMOS transistor N8. The NMOS transistor N8 has a source terminal 2010 coupled to ground and has a gate terminal 2012 coupled to receive the second inversion signal from the low-side buffer 104. When the second inversion signal is LOW, the NMOS transistor N8 is turned OFF to prevent a short circuit conduction path between the I/O voltage V_I/O and ground. The third inverter stage provides a third inversion signal at the drain terminal 290.

With continuing reference to FIG. 2, the high-side buffer 120 also includes a second cascode stage comprising PMOS transistors P10 and P11 coupled between the I/O terminal 126 and the buffer terminal 110. The PMOS transistor P10 includes a source terminal 2014 coupled to the I/O terminal 126 and includes a gate terminal 2016 coupled to receive the third inversion signal. The PMOS transistor P10 has a drain terminal 2018 coupled to a source terminal 2020 of the PMOS transistor P11. The PMOS transistor P11 has a drain terminal 2022 coupled to the buffer node 110 and has a gate terminal 2024 coupled to the bias voltage Vbias. The second cascode stage is configured to provide the I/O voltage V_I/O at the buffer terminal 110 when the input signal is equal to V_I/O (i.e.,HIGH).

With continuing reference to FIG. 2, the output stage 140 includes a third switch S3 having a gate terminal 2030 coupled to the reference voltage Vref and having a drain terminal 2032 coupled to the buffer terminal 110. The third switch S3 is configured to remain ON to provide a conduction path between the drain terminal 2032 and a source terminal 2036. In one exemplary embodiment, the third switch S3 is a drain extended NMOS transistor N13.

With continuing reference to FIG. 2, the output stage 140 includes a fourth inverter stage comprising a PMOS transistor P14 and an NMOS transistor N14 coupled between the low voltage terminal 142 and ground. The PMOS transistor P14 includes a source terminal 2040 coupled to the low voltage terminal 142 and includes a drain terminal 2042 coupled to a drain terminal 2044 of the NMOS transistor N14. The PMOS and NMOS transistors P14 and N14 include respective gate terminals 2046 and 2048 coupled to the source terminal 2036 of the third switch S3. The NMOS transistor N14 includes a source terminal 2050 coupled to ground. The PMOS and NMOS transistors P14 and N14 are configured to provide a fourth inversion signal at an output defined by the drain terminals 2042 and 2044.

With continuing reference to FIG. 2, the output stage includes a fifth inverter stage comprising a PMOS transistor P15 and an NMOS transistor N15 coupled between the low voltage terminal 142 and ground. The PMOS transistor P15 includes a source terminal 2052 coupled to the low voltage terminal 142, and includes a drain terminal 2054 coupled to a drain terminal 2056 of the NMOS transistor N15. The PMOS and NMOS transistors P15 and N15 include respective gate terminals 2058 and 2060 coupled to receive the fourth inversion signal from the PMOS and NMOS transistors P14 and N14. The NMOS transistor N15 includes a source terminal 2062 coupled to ground. Responsive to the fourth inversion signal, the PMOS and NMOS transistors P15 and N15 provide the output signal Vout at the drain terminals 2054 and 2056 which define the output of the receiver 100.

In one exemplary embodiment of the disclosure, a PMOS transistor P16 is coupled between the I/O terminal 126 and the gate terminal 288 of the PMOS transistor P8. The PMOS transistor P16 is configured to provide a small leakage current to ensure that the voltage at the source terminal 284 of the PMOS transistor P7 is held at $V_{BIAS}+V_{tp}$, where $V_{tp}$ is a threshold voltage required to turn ON the PMOS transistor P7. By holding the voltage at the source terminal 284 of the PMOS transistor P7 at $V_{BIAS}+V_{tp}$, the PMOS transistor P16 prevents the PMOS transistors P6 and P7 from completely turning OFF (when receiving low voltages at the input terminal).

In one exemplary embodiment of the disclosure, a PMOS transistor P17 is coupled between the I/O terminal 126 and the source terminal 292 of the PMOS transistor P9. As discussed before, the PMOS transistors P6 and P7 act as pass gates and remain ON. When the input voltage Vin is equal to V_I/O (i.e., HIGH), the PMOS transistor P8 is turned OFF because V_I/O (i.e., HIGH) is applied to the gate terminal 288 of the PMOS transistor P8. To prevent the PMOS transistor P9 from completely turning OFF when the PMOS transistor P8 is OFF, the PMOS transistor P17 provides a small leakage current to the source terminal 292 which prevents the PMOS transistor P9 from turning OFF completely.

Figure 3:
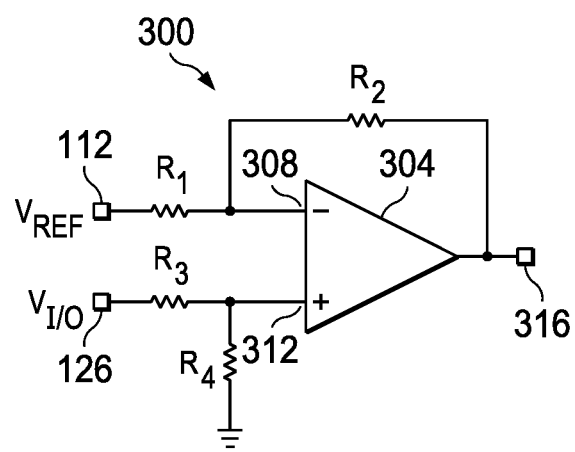
FIG. 3 illustrates a voltage subtractor in accordance with an exemplary embodiment of the present disclosure.

FIG. 3 illustrates a voltage subtractor 300 in accordance with an exemplary embodiment. The voltage subtractor 300 can be realized with an operational amplifier 304 having an inverting input terminal 308, a non-inverting input terminal 312 and an output terminal 316. A resistor R1 is coupled between the inverting input terminal 308 and the reference voltage terminal 112, and a resistor R2 is coupled between the output terminal 316 and the inverting input terminal 308 to provide a negative feedback. A resistor R3 is coupled between the non-inverting input terminal 312 and the I/O terminal 126, and a resistor R4 is coupled between the non-inverting input terminal 312 and ground. Responsive to a difference between Vref and V_I/O, the voltage subtractor 300 provides the bias voltage Vbias at the output terminal 316. Since the bias voltage Vbias is produced by subtracting Vref from V_I/O, the receiver 200 can reliably receive the input voltages without detecting I/O supply level and without requiring memory to store I/O supply level information.

In operation, when Vin is LOW (e.g., 0V), the NMOS transistor N1 which acts as a pass gate applies a LOW voltage to the gate terminals 244 and 246 of the respective PMOS and NMOS transistors P2 and N2 (i.e., first inverter stage). As a result, the PMOS transistor P2 is turned ON but the NMOS transistor N2 is turned OFF, thereby setting the drain terminals 236 and 238 to the reference voltage Vref (e.g., 1.8V).

Thus, with the reference voltage Vref being applied to the gate terminals 250 and 252 of the PMOS and NMOS transistors P4 and N4 (i.e., second inverter stage), the PMOS transistor P4 is turned OFF but the NMOS transistor N4 is turned ON, thereby pulling the drain terminals 254 and 256 LOW to ground. Also, the gate terminal 2012 of the NMOS transistor N8 is pulled LOW to ground, thereby turning OFF the NMOS transistor N8. As a result, a short circuit conduction path between the I/O voltage V_I/O and ground is prevented. Since the gate terminal of the NMOS transistor N6 is coupled to the drain terminals 236 and 238, the NMOS transistor N6 is turned ON by the reference voltage Vref. Also, since the NMOS transistor N5 is configured to remain ON, the buffer terminal 110 is pulled LOW to ground.

At the output stage 140, the third switch S3 acting as a pass gate couples the buffer terminal 110 to the gate terminals 2046 and 2048 of the respective PMOS and NMOS transistors P14 and P15 (i.e., fourth inverter stage). With the buffer terminal 110 being pulled to LOW (i.e., ground) and responsive to a LOW voltage (i.e., ground) applied to the gate terminals 2046 and 2048, the PMOS transistor P14 is turned ON but the NMOS transistor N14 is turned OFF, thereby setting the drain terminals 2042 and 2044 up to a second level voltage V2L (e.g., 1V). The second voltage level V2L is also referred to as the low voltage supply. Since the second level voltage V2L is applied to the gate terminals 2058 and 2060 of the respective PMOS and NMOS transistors P15 and N15, the PMOS transistor P15 is turned OFF but the NMOS transistor N15 is turned ON, thereby pulling the output (defined by the drain terminals 2054 and 2056) LOW to ground.

When Vin is equal to V_I/O (e.g., HIGH), the second switch S2 comprising the PMOS transistors P6 and P7 which acts as a pass gate applies V_I/O to the gate terminal 288 of the PMOS transistor P8, thereby turning OFF the PMOS transistor P8. However, when Vin is equal to V_I/O, the second inversion signal at the drain terminals 254 and 256 of the PMOS and NMOS transistors P4 and N4 is set to Vref, thereby turning ON the NMOS transistor N8. As a result, the gate terminal 2016 of the PMOS transistor P10 is pulled to Vbias+Vtp, thereby turning ON the PMOS transistor P10. Since the PMOS transistor P11 is configured to remain ON due to Vbias being applied to its gate terminal 2024, the voltage at the buffer terminal 110 is set to V_I/O.

At the output stage 140, with the buffer terminal 110 being set to V_I/O, the third switch S3 applies Vref−Vtn to the fourth inverter stage comprising the PMOS and NMOS transistors P14 and N14, which pulls the gate terminals 2058 and 2060 of the PMOS and NMOS transistors P15 and N15 LOW to ground. As a result, the PMOS transistor P15 is turned ON but the NMOS transistor N15 is turned OFF, thus providing the second level voltage V2L at the output terminal. The second voltage level V2L is lower than V_I/O.

Thus, when Vin is equal to V_I/O (i.e., HIGH), the buffer node 110 is set to V_I/O (i.e., HIGH). The output stage 140, which is coupled to the node 110, steps down the voltage level from V_I/O to V2L. When Vin is LOW (i.e., ground), the buffer node 110 is pulled down to LOW (i.e., ground), and the output stage 140 provides a LOW voltage.

In one aspect of the present disclosure, the receiver 100 is configured to operate in a wide range of input voltages. As discussed before, the receiver 100 includes the first and second switches S1 and S2 coupled to receive the input voltage Vin. Since the first switch S1 is a drain extended NMOS transistor N1 configured to withstand an input voltage up to 3.3V and the second switch includes a drain extended PMOS transistor P6 configured to withstand an input voltage up to 3.3V, the receiver 100 operates in a wide range of input voltage level (e.g., 1.8V-3.3V).

In one aspect of the present disclosure, the first, second and third inverter stages prevent a crowbar window (i.e., dynamic short circuit window) from V_I/O to ground through the first and second cascode stages. The crowbar window causes the buffer terminal 110 to be stuck at an unknown voltage. During a transition of the input signal Vin, the gate terminal of the NMOS transistor N6 and the gate terminal of the PMOS transistor P10 are momentarily held at ground and V_I/O, respectively. Thus, the first and second cascode stages remain OFF during the transition of the input signal Vin. As a result, the buffer terminal 110 retains its previous state during a float window. Since the NMOS transistor N6 and the PMOS transistor P10 do not turn ON concurrently, the buffer terminal 110 turns ON/OFF without any contentions, thereby resulting in a smaller duty cycle spread at the output terminal. Also, the float window causes the voltage at the buffer terminal to be a high slew rate version of the input signal Vin, thus minimizing information loss.

Figure 5:
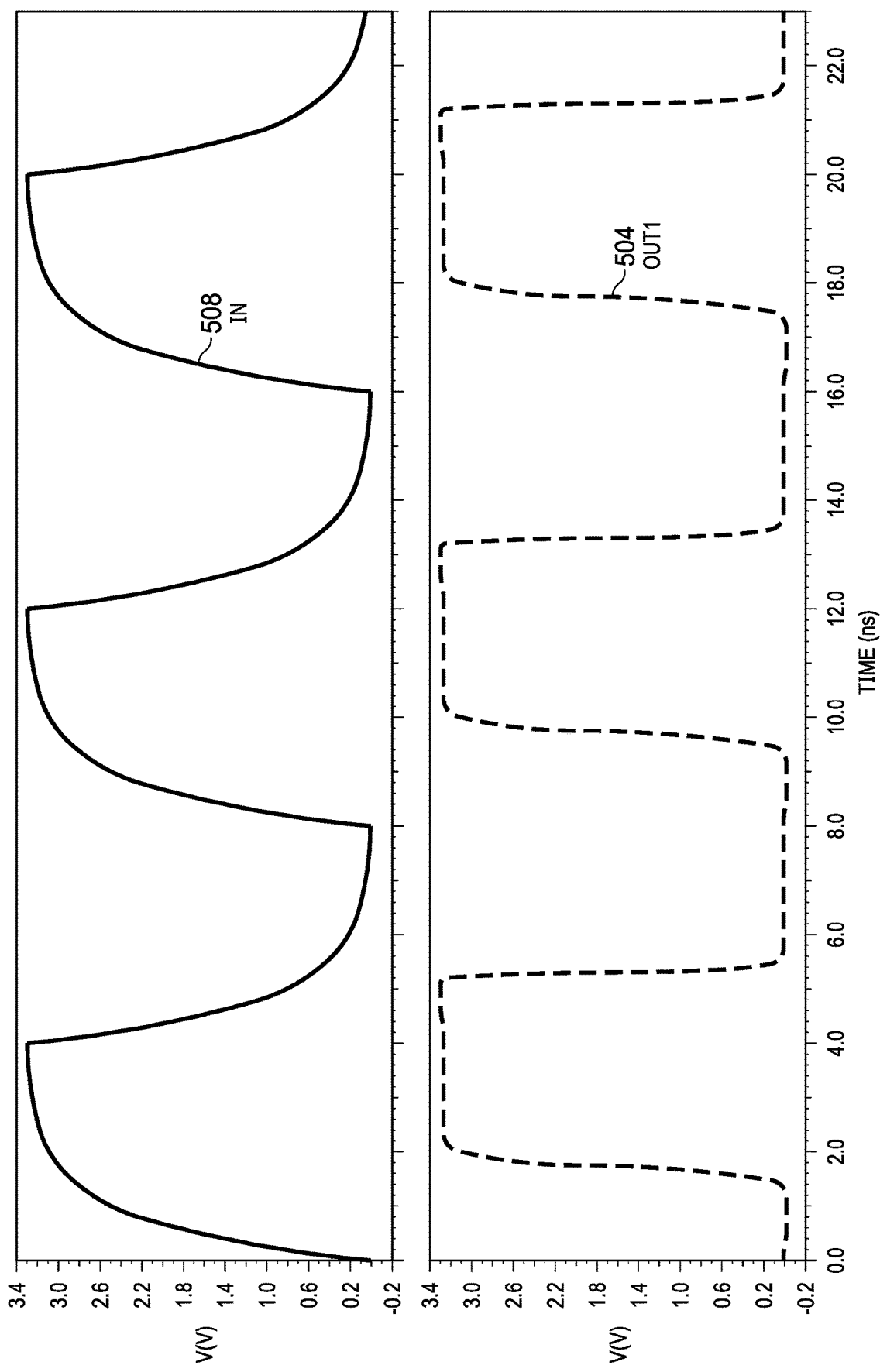

FIG. 4 is a timing diagram of first and third inversion signals 404 and 408 when Vin oscillates at, for example, 125 MHz. The float windows indicate that the transistors P10 and N6 operate reliably without causing a short circuit even at higher frequencies. FIG. 5 is a timing diagram of the input voltage 504 (Vin at 125 MHz, e.g.,) and a resulting voltage 508 at the buffer terminal 110.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A receiver, comprising:
    a low-side buffer having an input terminal coupled to receive an input signal and having an output terminal coupled to a buffer terminal and having a reference voltage terminal coupled to receive a reference voltage, wherein responsive to the input signal being LOW the low-side buffer is configured to couple the buffer terminal to ground;
    a high-side buffer having an input terminal coupled to receive the input signal and having an output terminal coupled to the buffer terminal and having an input/output (I/O) terminal coupled to an I/O voltage and having a bias terminal coupled to a bias voltage, wherein responsive to the input signal being HIGH the high-side buffer is configured to provide the I/O voltage at the buffer terminal;
    a voltage subtractor configured to provide the bias voltage responsive to a difference between the reference voltage and the I/O voltage; and
    an output stage coupled to the buffer terminal and having a low voltage terminal configured to receive a low supply voltage, the output stage configured to provide an output voltage responsive to the I/O voltage at the buffer terminal, wherein the output voltage is lower than the I/O voltage,
    wherein the low-side buffer is configured to prevent a short circuit conduction path between the reference voltage and ground when the input signal is HIGH, and
    wherein the high-side buffer is configured to prevent a short circuit conduction path between the I/O voltage and ground when the input signal is LOW.

2. The receiver of claim 1, wherein the low-side buffer comprises:
    a first switch having a gate terminal coupled to the reference voltage terminal and configured to remain ON responsive to the reference voltage, the first switch having a drain terminal coupled to the input terminal of the low-side buffer, the first switch configured to provide a first pass signal at a source terminal responsive to the input signal;
    a first inverter stage coupled between the reference voltage terminal and ground, the first inverter stage having an input terminal coupled to receive the first pass signal and configured to provide a first inversion signal responsive to the first pass signal;
    a low-side feedback MOSFET having a source terminal coupled to the reference voltage terminal and having a drain terminal coupled to the input terminal of the first inverter stage and having a gate terminal coupled to receive the first inversion signal, the low-side MOSFET configured to apply the reference voltage to the input terminal of the first inverter stage to prevent the short circuit conduction path between the reference voltage and ground;
    a second inverter stage coupled between the reference voltage terminal and ground and having an input terminal coupled to receive the first inversion signal, the second inverter stage configured to provide a second inversion signal responsive to the first inversion signal; and
    a first cascode stage coupled between the buffer terminal and ground and having an input terminal coupled to receive the first inversion signal, the first cascode stage configured to couple the buffer terminal to ground responsive to the input signal being LOW.

3. The receiver of claim 1, wherein the high-side buffer comprises:
    a second switch having first and second gate terminals coupled to the bias voltage terminal, the second switch having a drain terminal coupled to the input terminal of the high-side buffer and configured to receive the input signal, the second switch configured to provide a second pass signal responsive to the input signal;
    a third inverter stage coupled between the I/O terminal and ground, the third inverter stage having a first input coupled to receive the second pass signal and configured to provide a third inversion signal responsive to the second pass signal, the third inverter stage having a second input coupled to receive the second inversion signal and configured to prevent the short circuit conduction path between the I/O voltage and ground in response to the second inversion signal; and
    a second cascode stage coupled between the I/O terminal and the buffer terminal, the second cascode stage configured to provide the I/O voltage at the buffer terminal when the input signal is HIGH.

4. The receiver of claim 1, wherein the output stage includes a third switch having a gate terminal coupled to the reference voltage terminal and having a drain terminal coupled to the buffer terminal, and wherein responsive to the reference voltage the third switch is configured to remain ON to provide a conduction path between its drain and source terminals.

5. The receiver of claim 4, wherein the output stage comprises:
  a fourth inverter stage coupled between the low supply voltage terminal and ground, the fourth inverter stage having an input terminal coupled to the source terminal of the third switch, and wherein the fourth inverter stage is configured to provide a fourth inversion signal; and
  a fifth inverter stage coupled between the low supply voltage terminal and ground, the fifth inverter stage having an input terminal coupled to receive the fifth inversion signal and configured to provide the output signal.

6. The receiver of claim 1, wherein the first switch is a drain-extended NMOS transistor configured to remain ON responsive to the reference voltage applied to its gate terminal.

7. The receiver of claim 1, wherein the first inverter stage includes a PMOS transistor and an NMOS transistor coupled in an inverter configuration, and wherein the gate terminals of the PMOS and NMOS transistors are coupled to receive the first pass signal, and wherein the drain terminals of the PMOS and NMOS transistors are coupled to provide the first inversion signal.

8. The receiver of claim 1, wherein the second inverter stage includes a PMOS transistor and an NMOS transistor coupled in an inverter configuration, and wherein the gate terminals of the PMOS and NMOS transistors are coupled to receive the first inversion signal, and wherein the drain terminals of the PMOS and NMOS transistors are coupled to provide the second inversion signal.

9. The receiver of claim 1, wherein the first cascode stage includes an upper and a lower NMOS transistors coupled between the buffer terminal and ground, and wherein the gate terminal of the upper NMOS transistor is coupled to the reference voltage terminal and the gate terminal of the lower NMOS transistor is coupled to receive the first inversion signal, and wherein the upper NMOS transistor is configured to remain ON responsive to the reference voltage applied to the gate terminal of the upper NMOS transistor.

10. The receiver of claim 1, wherein the second switch comprises a drain-extended PMOS transistor and a second PMOS transistor coupled together, the drain-extended PMOS transistor having a drain terminal coupled to the input terminal of the high-side buffer, the drain-extended PMOS transistor having a source terminal coupled to a drain terminal of the second PMOS transistor, the drain-extended PMOS transistor and the second PMOS transistor having gate terminals coupled to the bias voltage terminal, and wherein the drain-extended PMOS transistor is configured to remain ON responsive to the bias voltage applied to the gate terminal.

11. The receiver of claim 1, wherein the third inverter stage comprises two PMOS transistors and an NMOS transistor coupled between the I/O voltage terminal and ground, the first PMOS transistor having a gate terminal coupled to receive the second pass signal and having a drain terminal to provide the third inversion signal, the NMOS transistor having a gate terminal coupled to receive the second inversion signal and configured to prevent the short circuit conduction path between the I/O voltage and ground when the second inversion signal is HIGH.

12. The receiver of claim 1, wherein the second cascode stage comprises a first PMOS transistor having a gate terminal coupled to receive the third inversion signal and a second PMOS transistor having a gate terminal coupled to the bias voltage terminal, the second PMOS transistor configured to remain on responsive to the bias voltage, the first and second PMOS transistors configured to provide the I/O voltage at the buffer terminal when the input signal is HIGH.

13. The receiver of claim 1, wherein the low-side feedback MOSFET is a PMOS transistor having a gate terminal coupled to receive the first inversion signal, and wherein the PMOS transistor is configured to turn ON when the first inversion signal is LOW to prevent the short circuit conduction path between the reference voltage and ground.

14. The receiver of claim 10, wherein the fourth inverter stage comprises a PMOS transistor and an NMOS transistor coupled in an inverter configuration, and wherein the gate terminals of the PMOS and NMOS transistors are coupled to the source terminal of the third switch.

15. The receiver of claim 10, wherein the fifth inverter stage comprises a PMOS transistor and an NMOS transistor coupled in an inverter configuration, and wherein the drain terminals of the PMOS and NMOS transistors are coupled to provide the output signal.

16. A receiver, comprising:
  a low-side buffer having an input terminal coupled to receive an input signal and having an output terminal coupled to a buffer terminal and having a reference voltage terminal configured to receive a reference voltage, the low-side buffer comprising:
  a first switch having a gate terminal coupled to the reference voltage terminal and configured to remain ON responsive to the reference voltage, the first switch having a drain terminal coupled to the input terminal of the low-side buffer, the first switch configured to provide a first pass signal at a source terminal responsive to the input signal;
  a first inverter stage coupled between the reference voltage terminal and ground, the first inverter stage having an input terminal coupled to receive the first pass signal and configured to provide a first inversion signal responsive to the first pass signal;
  a low-side feedback MOSFET having a source terminal coupled to the reference voltage terminal and having a drain terminal coupled to the input terminal of the first inverter stage and having a gate terminal coupled to receive the first inversion signal, the low-side MOSFET configured to apply the reference voltage to the input terminal of the first inverter stage to prevent a short circuit conduction path between the reference voltage and ground when the input signal is HIGH;
  a second inverter stage coupled between the reference voltage terminal and ground and having an input terminal coupled to receive the first inversion signal, the second inverter stage configured to provide a second inversion signal responsive to the first inversion signal;
  a first cascode stage coupled between the buffer terminal and ground and having an input terminal coupled to receive the first inversion signal, the first cascode stage configured to couple the buffer terminal to ground responsive to the input signal being LOW;
  a high-side buffer having an input terminal coupled to receive the input signal and having an output terminal coupled to the buffer terminal and having an input/output (I/O) terminal configured to receive an I/O voltage and having a bias terminal coupled to a bias voltage, the high-side buffer comprising:
- a second switch having first and second gate terminals coupled to the bias voltage terminal, the second switch having a drain terminal coupled to the input terminal of the high-side buffer, the second switch configured to provide a second pass signal responsive to the input signal;
- a third inverter stage coupled between the I/O terminal and ground, the third inverter stage having a first input coupled to receive the second pass signal and configured to provide a third inversion signal responsive to the second pass signal, the third inverter stage having a second input coupled to receive the second inversion signal and configured to prevent a short circuit conduction path between the I/O voltage and ground;
- a second cascode stage coupled between the I/O terminal and the buffer terminal, the second cascode stage having a first input terminal coupled to receive the third inversion signal, the second cascode stage configured to provide the I/O voltage at the buffer terminal when the input signal is HIGH;
- a voltage subtractor configured to provide the bias voltage responsive to a difference between the reference voltage and the I/O voltage; and
- an output stage coupled to the buffer terminal and having a low voltage terminal configured to receive a low supply voltage, the output stage configured to provide an output signal responsive to the I/O voltage at the buffer terminal.

17. The receiver of claim 16, wherein the first switch is a drain-extended NMOS transistor configured to remain ON responsive to the reference voltage applied to its gate terminal.

18. The receiver of claim 16, wherein the first inverter stage includes a PMOS transistor and an NMOS transistor coupled in an inverter configuration, and wherein the gate terminals of the PMOS and NMOS transistors are coupled to receive the first pass signal, and wherein the drain terminals of the PMOS and NMOS transistors are coupled to provide the first inversion signal.

19. The receiver of claim 16, wherein the second inverter stage includes a PMOS transistor and an NMOS transistor coupled in an inverter configuration, and wherein the gate terminals of the PMOS and NMOS transistors are coupled to receive the first inversion signal, and wherein the drain terminals of the PMOS and NMOS transistors are coupled to provide the second inversion signal.

20. The receiver of claim 16, wherein the first cascode stage includes an upper and a lower NMOS transistors coupled between the buffer terminal and ground, and wherein the gate terminal of the upper NMOS transistor is coupled to the reference voltage terminal and the gate terminal of the lower NMOS transistor is coupled to receive the first inversion signal, and wherein the upper NMOS transistor is configured to remain ON responsive to the reference voltage applied to the gate terminal of the upper NMOS transistor.

21. The receiver of claim 16, wherein the second switch comprises a drain-extended PMOS transistor and a second PMOS transistor coupled together, the drain-extended PMOS transistor having a drain terminal coupled to the input terminal of the high-side buffer, the drain-extended PMOS transistor having a source terminal coupled to a drain terminal of the second PMOS transistor, the drain-extended PMOS transistor and the second PMOS transistor having gate terminals coupled to the bias voltage terminal, and wherein the drain-extended PMOS transistor is configured to remain ON responsive to the bias voltage applied to the gate terminal.

22. The receiver of claim 16, wherein the third inverter stage comprises two PMOS transistors and an NMOS transistor coupled between the I/O voltage terminal and ground, the first PMOS transistor having a gate terminal coupled to receive the second pass signal and having a drain terminal to provide the third inversion signal, the NMOS transistor having a gate terminal coupled to receive the second inversion signal and configured to prevent the short circuit conduction path between the I/O voltage and ground when the second inversion signal is HIGH.

23. The receiver of claim 16, wherein the second cascode stage comprises a first PMOS transistor having a gate terminal coupled to receive the third inversion signal and a second PMOS transistor having a gate terminal coupled to the bias voltage terminal, the second PMOS transistor configured to remain ON responsive to the bias voltage, the first and second PMOS transistors configured to provide the I/O voltage at the buffer terminal when the input signal is HIGH.

24. The receiver of claim 16, wherein the low-side feedback MOSFET is a PMOS transistor having a gate terminal coupled to receive the first inversion signal, and wherein the PMOS transistor is configured to turn ON when the first inversion signal is LOW to prevent the short circuit conduction path between the reference voltage and ground.

25. The receiver of claim 16, wherein the output stage comprises a PMOS transistor and an NMOS transistor coupled in an inverter configuration, and wherein the gate terminals of the PMOS and NMOS transistors are coupled to the source terminal of the third switch.

26. The receiver of claim 16, wherein the output stage comprises a PMOS transistor and an NMOS transistor coupled in an inverter configuration, and wherein the drain terminals of the PMOS and NMOS transistors are coupled to provide the output signal.

27. A receiver, comprising:
- a low-side buffer having an input terminal coupled to receive an input signal and having an output terminal coupled to a buffer terminal and having a reference voltage terminal coupled to receive a reference voltage, wherein responsive to the input signal being LOW the low-side buffer is configured to couple the buffer terminal to ground;
- a high-side buffer having an input terminal coupled to receive the input signal and having an output terminal coupled to the buffer terminal and having an input/output (I/O) terminal coupled to receive an I/O voltage and having a bias terminal coupled to receive a bias voltage, wherein responsive to the input signal being HIGH the high-side buffer is configured to provide the I/O voltage at the buffer terminal; and
- an output stage coupled to the buffer terminal and having a low voltage terminal configured to receive a low supply voltage, the output stage configured to provide an output signal responsive to the I/O voltage at the buffer terminal, wherein the output signal is lower than the I/O voltage.

28. The receiver of claim 27, wherein the low-side buffer is configured to prevent a short circuit conduction path between the reference voltage and ground when the input signal is HIGH, and wherein the high-side buffer is configured to prevent a short circuit conduction path between the I/O voltage and ground when the input signal is LOW.

29. The receiver of claim 27, further comprising a voltage subtractor configured to provide the bias voltage responsive to a difference between the reference voltage and the I/O voltage.

30. The receiver of claim 27, wherein the low-side buffer comprises:
- a first switch having a gate terminal coupled to the reference voltage terminal and configured to remain ON responsive to the reference voltage, the first switch having a drain terminal coupled to the input terminal of the low-side buffer, the first switch configured to provide a first pass signal at a source terminal responsive to the input signal;
- a first inverter stage coupled between the reference voltage terminal and ground, the first inverter stage having an input terminal coupled to receive the first pass signal and configured to provide a first inversion signal responsive to the first pass signal;
- a low-side feedback MOSFET having a source terminal coupled to the reference voltage terminal and having a drain terminal coupled to the input terminal of the first inverter stage and having a gate terminal coupled to receive the first inversion signal, the low-side MOSFET configured to apply the reference voltage to the input terminal of the first inverter stage to prevent a short circuit conduction path between the reference voltage and ground when the input signal is HIGH;
- a second inverter stage coupled between the reference voltage terminal and ground and having an input terminal coupled to receive the first inversion signal, the second inverter stage configured to provide a second inversion signal responsive to the first inversion signal; and
- a first cascode stage coupled between the buffer terminal and ground and having an input terminal coupled to receive the first inversion signal, the first cascode stage configured to couple the buffer terminal to ground responsive to the input signal being LOW.

31. The receiver of claim 27, wherein the high-side buffer comprises:
- a second switch having first and second gate terminals coupled to the bias voltage terminal, the second switch having a drain terminal coupled to the input terminal of the high-side buffer, the second switch configured to provide a second pass signal responsive to the input signal;
- a third inverter stage coupled between the I/O terminal and ground, the third inverter stage having a first input coupled to receive the second pass signal and configured to provide a third inversion signal responsive to the second pass signal, the third inverter stage having a second input coupled to receive the second inversion signal and configured to prevent a short circuit conduction path between the I/O voltage and ground when the input signal is LOW; and
- a second cascode stage coupled between the I/O terminal and the buffer terminal, the second cascode stage having a first input terminal coupled to receive the third inversion signal, the second cascode stage configured to provide the I/O voltage at the buffer terminal when the input signal is HIGH.

32. The receiver of claim 27, wherein the output stage comprises a PMOS transistor and an NMOS transistor coupled in an inverter configuration, and wherein the gate terminals of the PMOS and NMOS transistors are coupled to the drain terminal of the third switch.

33. The receiver of claim 27, wherein the output stage comprises a PMOS transistor and an NMOS transistor coupled in an inverter configuration, and wherein the drain terminals of the PMOS and NMOS transistors are coupled to provide the output signal responsive to the I/O voltage at the buffer terminal, and wherein the output signal is lower than the I/O voltage.

* * * * *